(12) United States Patent
Tran et al.

(10) Patent No.: US 11,728,139 B2
(45) Date of Patent: *Aug. 15, 2023

(54) PROCESS CHAMBER FOR CYCLIC AND SELECTIVE MATERIAL REMOVAL AND ETCHING

(71) Applicant: Applied Materials, Inc., Santa Clara, CA (US)

(72) Inventors: Toan Q. Tran, San Jose, CA (US); Soonam Park, Sunnyvale, CA (US); Junghoon Kim, Santa Clara, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 151 days.

This patent is subject to a terminal disclaimer.

(21) Appl. No.: 17/219,360

(22) Filed: Mar. 31, 2021

(65) Prior Publication Data

US 2021/0217591 A1 Jul. 15, 2021

Related U.S. Application Data

(63) Continuation of application No. 14/994,425, filed on Jan. 13, 2016, now Pat. No. 11,004,661.

(Continued)

(51) Int. Cl.
*H01J 37/32* (2006.01)
*H01L 21/67* (2006.01)
(Continued)

(52) U.S. Cl.
CPC .. *H01J 37/32357* (2013.01); *H01J 37/32082* (2013.01); *H01J 37/32449* (2013.01);
(Continued)

(58) Field of Classification Search
None
See application file for complete search history.

(56) References Cited

U.S. PATENT DOCUMENTS

| | | | | |
|---|---|---|---|---|
| 5,882,411 A | * | 3/1999 | Zhao | C23C 16/455 118/715 |
| 6,106,625 A | * | 8/2000 | Koai | C23C 16/455 118/724 |

(Continued)

FOREIGN PATENT DOCUMENTS

| | | |
|---|---|---|
| CN | 103094045 B | 1/2018 |
| JP | H02-120833 U | 9/1990 |

(Continued)

OTHER PUBLICATIONS

Vila, R. et al. "Dielectric spectroscopy of alumina ceramics overa wide frequency range." 1998 J. Nuclear Materials, 253, p. 141-148. (Year: 1998).*

(Continued)

*Primary Examiner* — Karla A Moore
*Assistant Examiner* — Margaret Klunk
(74) *Attorney, Agent, or Firm* — Patterson + Sheridan, LLP

(57) ABSTRACT

A method and apparatus for substrate etching are described herein. A processing chamber described herein includes a source module, a process module, a flow module, and an exhaust module. An RF source may be coupled to the chamber and a remote plasma may be generated in the source module and a direct plasma may be generated in the process module. Cyclic etching processes described may use alternating radical and direct plasmas to etch a substrate.

18 Claims, 4 Drawing Sheets

Related U.S. Application Data

(60) Provisional application No. 62/214,902, filed on Sep. 4, 2015.

(51) Int. Cl.
  *H01L 21/683* (2006.01)
  *H01L 21/311* (2006.01)

(52) U.S. Cl.
  CPC ...... *H01J 37/32834* (2013.01); *H01L 21/311* (2013.01); *H01L 21/67069* (2013.01); *H01L 21/6831* (2013.01)

(56) References Cited

U.S. PATENT DOCUMENTS

| | | | |
|---|---|---|---|
| 7,013,834 B2 * | 3/2006 | Tyler | H01J 37/32357 156/345.43 |
| 7,879,184 B2 | 2/2011 | Hudson et al. | |
| 10,504,700 B2 * | 12/2019 | Tran | H01J 37/32082 |
| 11,004,661 B2 * | 5/2021 | Tran | H01L 21/67069 |
| D948,658 S | 4/2022 | Miller et al. | |
| 2002/0129902 A1 | 9/2002 | Babayan et al. | |
| 2007/0001935 A1 | 8/2007 | Jan | |
| 2007/0264443 A1 * | 11/2007 | Choi | C23C 16/4401 118/723 R |
| 2008/0001788 A1 | 7/2008 | Paterson et al. | |
| 2008/0178807 A1 * | 7/2008 | Wang | C23C 16/45565 118/723 R |
| 2012/0000315 A1 | 2/2012 | Dhindsa et al. | |
| 2012/0180954 A1 * | 7/2012 | Yang | H01J 37/32449 156/345.33 |
| 2013/0000821 A1 | 4/2013 | Yang et al. | |
| 2013/0001531 A1 | 6/2013 | Fang et al. | |
| 2014/0060572 A1 * | 3/2014 | Yasumuro | H01L 21/02065 134/1.2 |
| 2014/0227881 A1 | 8/2014 | Lubomirsky et al. | |
| 2014/0283746 A1 | 9/2014 | Seo et al. | |
| 2014/0342569 A1 | 11/2014 | Zhu et al. | |
| 2015/0017810 A1 | 1/2015 | Guha | |
| 2015/0041061 A1 | 2/2015 | Shoji et al. | |
| 2015/0072508 A1 | 3/2015 | Or et al. | |
| 2015/0129545 A1 | 5/2015 | Ingle et al. | |
| 2017/0069466 A1 | 3/2017 | Tran et al. | |

FOREIGN PATENT DOCUMENTS

| | | |
|---|---|---|
| JP | H08-288266 A | 11/1996 |
| JP | 2013-84602 A | 5/2013 |
| JP | 2013-541177 A | 11/2013 |
| JP | 2014-196561 A | 10/2014 |
| JP | 2015-19065 A | 1/2015 |
| JP | 2015-65434 A | 4/2015 |
| KR | 1020130075632 | 7/2013 |
| TW | 201442071 A | 11/2014 |
| TW | 201448026 A | 12/2014 |
| TW | 201502310 A | 1/2015 |
| TW | 201532139 A | 8/2015 |
| WO | 2008/123060 A1 | 10/2008 |

OTHER PUBLICATIONS

Taiwan Office Action dated Jul. 16, 2021, for Taiwan Patent Application No. 109126612.
Japanese Office Action dated May 10, 2022 for Application No. 2021-042869.
International Search Report and Written Opinion for International Application No. PCT/US2016/045202 dated Nov. 10, 2016.
Chinese Office Action dated Jan. 2, 2019 for Application No. 201680013408.X.
Office Action for Chinese Application No. 201680013408.X dated Jan. 2, 2019.
Search Report for Chinese Application No. 201680013408.X dated Dec. 17, 2018.
CN Office Action dated Aug. 21, 2019 for Application No. 201680013408.X.
Office Action for Taiwan Application No. 105126062 dated Feb. 12, 2020.
Search Report for Taiwan Application No. 105126062 dated Feb. 12, 2020.
Japanese Office Action dated Aug. 18, 2020 for Application No. 2017-544317.
Office Action for Taiwan Application No. 110143903 dated Dec. 2, 2022.
Search Report for Taiwan Application No. 110143903 dated Dec. 1, 2022.
Office Action for Taiwan Application No. 110143903 dated Apr. 25, 2023.

* cited by examiner

PROCESS CHAMBER FOR CYCLIC AND SELECTIVE MATERIAL REMOVAL AND ETCHING

CROSS-REFERENCE TO RELATED APPLICATIONS

This application is a continuation application of U.S. patent application Ser. No. 14/994,425, filed Jan. 13, 2016, which claims benefit of U.S. Provisional Patent Application No. 62/214,902, filed Sep. 4, 2015, the entirety of which is herein incorporated by reference.

BACKGROUND

Field

Embodiments of the present disclosure relate to apparatus and methods for processing semiconductor substrates. More specifically, embodiments of the present disclosure relate to a processing chamber having a radical plasma source and a direct plasma source configured to perform cyclic etching processes.

Description of the Related Art

Electronic devices, such as flat panel displays and integrated circuits, are commonly fabricated by a series of processes in which layers are deposited on a substrate and the deposited material is etched into desired patterns. The processes commonly include physical vapor deposition (PVD), chemical vapor deposition (CVD), plasma enhanced CVD (PECVD), and other plasma processing. Specifically, a plasma process includes supplying a process gas mixture to a vacuum chamber, and applying radial frequency power (RF power) to excite the process gas into a plasma state. The plasma decomposes the gas mixture into ion species that perform the desired deposition or etch processes.

One problem encountered during plasma processes is the difficulty associated with establishing uniform plasma density over the substrate surface during processing, which leads to non-uniform processing between the center region and the edge regions of a substrate. The difficulty in establishing uniform plasma density may be contributed by skews in natural electrical current, gas flow, and thermal distribution due to asymmetries in the physical process chamber design. Such skews not only result in non-uniform plasma density, but also make it difficult to use other processing variables to control plasma uniformity. Thus, multiple processing chambers may be necessary to satisfy various processing operations.

Additionally, in some substrate processing systems, a plasma is generated in the same location as one or more substrates being processed; in other examples, a plasma is generated in one location and moves to another location where the substrate(s) are processed. The plasmas produced often contain highly energetic and/or corrosive species and/or highly energetic electrons, such that the equipment producing the plasma sometimes degrades from contact with the energetic species and/or electrons. For example, materials that are exposed to highly energetic species and/or electrons may be etched and/or sputtered, generating etched and/or sputtered material that can move about, and can react or deposit on various surfaces of chamber components thereby damaging or requiring increased chamber maintenance intervals.

Existing dry etching chamber are implemented for anisotropic etching with high ion energy for high aspect ratio structure etching. However, due to the high ion energy bombardment, the substrate may be damages by the plasma which results in device current leakage. Also, redeposition of byproducts man anisotropic etching difficult.

As technology nodes progress, the need for increasingly small and selective etching capabilities are paramount. Therefore, there is a need for a process chamber that enables variable process volume, improved flow conductance, and improved process uniformity which can be implemented for advanced technology nodes. In addition, there is a need for etching methods which provide improved material selectivity.

SUMMARY

In one embodiment, a processing chamber apparatus is provided. The apparatus includes a chamber body defining a process region and configured to generate a direct plasma therein and a substrate support assembly comprising an electrostatic chuck may be disposed within the process region. A source module comprising a plate stack may be coupled to the chamber body and the plate stack may further define the process region and be configured to generate a remote plasma therein. A flow module may be coupled to the chamber body and an exhaust module comprising a symmetric flow valve and a symmetric turbo molecular pomp may be coupled to the flow module. The chamber body, the source module, the flow module, and the exhaust module may be configured to symmetrically process a substrate.

In another embodiment, a processing chamber apparatus is provided. The apparatus includes a chamber body defining a process region and a substrate support assembly comprising an electrostatic chuck may be disposed within the process region. A source module comprising a plate stack may also be coupled to the chamber body. The plate stack may include a first diffuser, a faceplate, a ceramic ring, a second diffuser, a gas distribution device, and a plasma blocking screen. A flow module may be coupled to the chamber body and an exhaust module may be coupled to the flow module.

In yet another embodiment, a method of processing a substrate is provided. The method includes generating a direct plasma in a processing region of a processing chamber and exposing a substrate disposed on a substrate support assembly in the processing region to ions generated by the direct plasma to modify a layer of the substrate. A remote plasma may be generated in a source module coupled to the processing chamber and the modified layer of the substrate may be exposed to radicals generated by the remote plasma to remove the modified layer from the substrate. The exposing the substrate to ion and the exposing the substrate to radicals may also be repeated.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to a chamber having a remote plasma source and a direct plasma source. The remote plasma source may be configured to generate radicals and the direct plasma source may be configured to generate ions. In addition, the chamber includes various apparatus to provide for improved symmetry during plasma processing of a substrate. In addition, methods for cyclic etching processes are disclosed.

Figure 1:
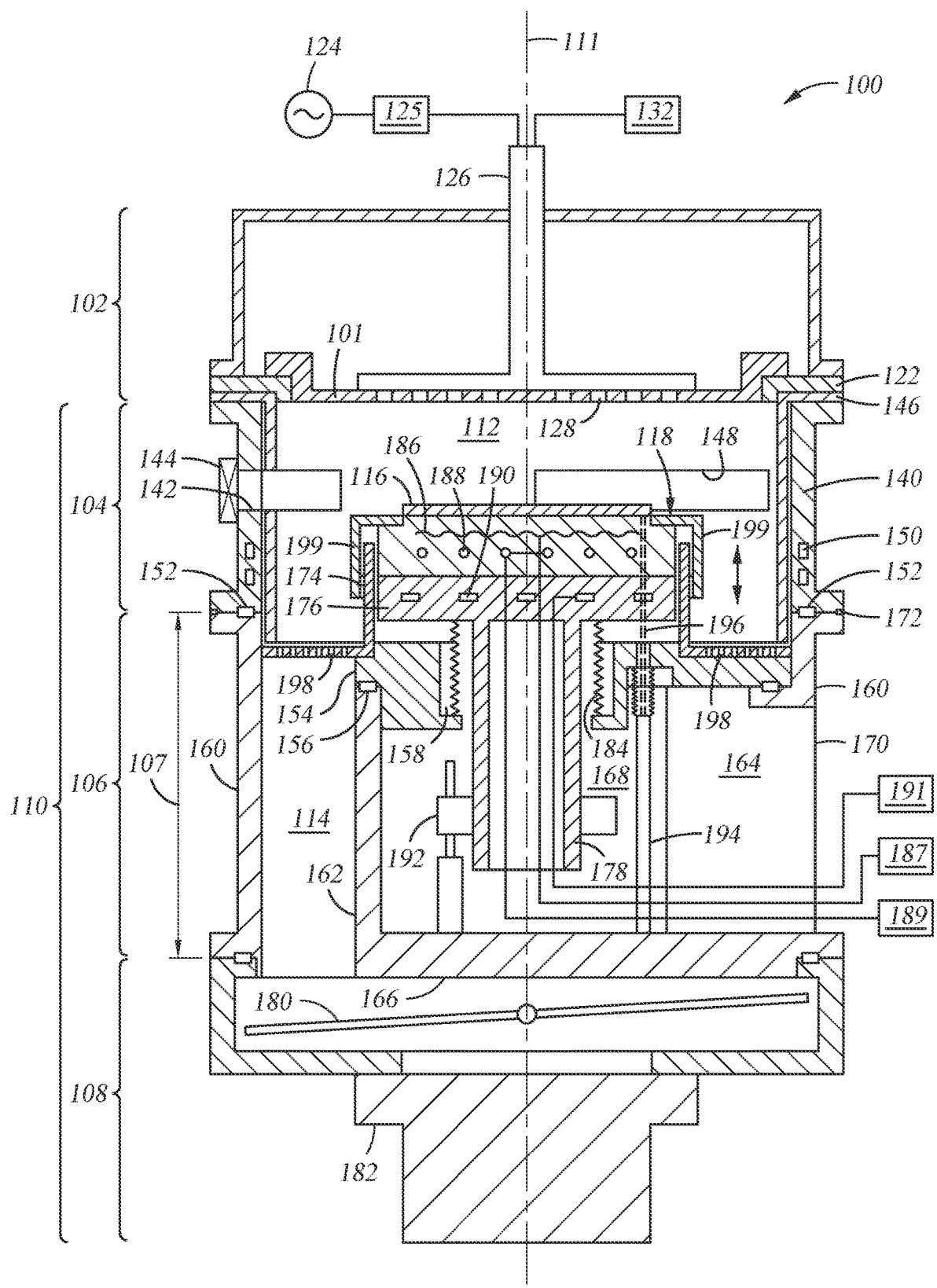
FIG. 1 is a schematic cross-sectional view of a plasma processing chamber according to one embodiment of the present disclosure.

FIG. 1 is a schematic sectional view of a plasma process chamber 100 according to one embodiment of the present disclosure. The plasma process chamber 100 may be a plasma etch chamber, a plasma enhanced chemical vapor deposition chamber, a physical vapor deposition chamber, a plasma treatment chamber, an ion implantation chamber, or other suitable vacuum processing chamber.

The plasma process chamber 100 may be assembled from multiple modules. The modular design enables the plasma process chamber 100 to meet various process requirements. As shown in FIG. 1, the plasma process chamber 100 may include a source module 102, a process module 104, a flow module 106, and an exhaust module 108. The source module 102, the process module 104 and the flow module 106 collectively enclose a process region 112. A more detailed description of the source module 102 may be had with reference to FIG. 2 and the source module described therein. The process module 104, the flow module 106, and the exhaust module 108 may be considered collectively as a chamber module 110 in certain embodiments.

During operation, a substrate 116 may be positioned on a substrate support assembly 118 and exposed to a process environment, such as plasma generated in the process region 112. Exemplary process which may be performed in the plasma process chamber 100 may include etching, chemical vapor deposition, physical vapor deposition, implantation, plasma annealing, plasma treating, abatement, or other plasma processes. Vacuum may be maintained in the process region 112 by suction from the exhaust module 108 through evacuation channels 114 defined by the flow module 106.

The process region 112 and the evacuation channels 114 are substantially symmetrically about a central axis 111 to provide symmetrical electrical current, gas flow, and thermal flow to establish uniform process conditions.

In one embodiment, as shown in FIG. 1, the source module 102 may be a capacitively coupled plasma source configured to generate one or more plasmas, at least one of which may be considered a remote plasma and one of which may be considered a direct plasma. The source module 102 may include a plate stack 101, which may function as an electrode (i.e. anode), isolated from and supported by the process module 104 by an isolator 122. The plate stack 101 may include various showerheads, diffusers, and screen/blocker plates arranged in a stacked orientation. The plate stack 101 may be connected to a gas source 132 through a gas inlet tube 126. The plate stack 101 and the gas inlet tube 126 may be all fabricated from a radio frequency (RF) conductive material, such as aluminum or stainless steel. The plate stack 101 may be coupled to a RF power source 124 via the conductive gas inlet tube 126. An RF matching network 125 may also be coupled to the RF power source 124. The conductive gas inlet tube 126 may be coaxial with the central axis 111 of the plasma process chamber 100 so that both RF power and processing gases are symmetrically provided.

Even though a capacitive plasma source is described above, the source module 102 may be any suitable gas/plasma source according to a process requirement. For example, the source module 102 may be an inductive coupled plasma source, a remote plasma source, or a microwave plasma source.

The process module 104 is coupled to the source module 102. The process module 104 may include a chamber body 140 enclosing the process region 112. The chamber body 140 may be fabricated from a conductive material resistive to processing environments, such as aluminum or stainless steel. The substrate support assembly 118 may be centrally disposed within the chamber body 140 and positioned to support the substrate 116 in the process region 112 symmetrically about the central axis 111.

A slit valve opening 142 may be formed through the chamber body 140 to allow passages of the substrate 116. A slit valve 144 may be disposed outside the chamber body 140 to selectively open and close the slit valve opening 142.

In one embodiment, an upper liner assembly 146 may be disposed within an upper portion of the chamber body 140 shielding the chamber body 140 from the process environment. The upper liner assembly 146 may include an opening 148 corresponding to the slit valve opening 142 formed in the chamber body 140. In one embodiment, the upper liner assembly 146 may include two or more openings 148 formed symmetrically about the central axis 111 to compensate for the asymmetry of the chamber body 140 caused by the slit valve opening 142, thus creating symmetry in the process region 112 within the plasma process chamber 100. For example, the upper liner assembly 146 may be a cylindrical wall having three identical openings 148 formed 120 degrees apart from one another. The upper liner assembly 146 may be constructed from a conductive, process compatible material, such as aluminum, stainless steel, and/or yttria (e.g., yttria coated aluminum).

In one embodiment, cooling channels 150 may be formed in the chamber body 140 to provide temperature control to the chamber body 140 and the upper liner assembly 146 to enhance the thermal symmetry within the plasma process chamber 100 and symmetry of the plasma provided in the process region 112.

The flow module 106 is attached to the process module 104. The flow module 106 provides flow paths between the process region 112 defined in the process module 104 and the exhaust module 108. The flow module 106 also provides an interface between the substrate support assembly 118 and the atmospheric environment exterior to the plasma process chamber 100.

The flow module 106 has a height 107. The height 107 may be selected according to amount of vertical movement or degree of variable volume dictated by the process requirements. Accordingly, when building a process chamber for a particular process, a flow module with a suitable height may be selected to meet the process requirements. The flow module may be swapped for another flow module with a different height when configuring the process chamber for a different process.

The flow module 106 includes an outer wall 160, an inner wall 162, two or more pairs of radial walls 164 connecting between the inner wall 162 and the outer wall 160, and a bottom wall 166 attached to the inner wall 162 and the two or more pairs of radial walls 164. The outer wall 160 may include two or more through holes 170 formed between each pair of radial walls 164. A chassis 154 may be sealingly disposed over the inner wall 162 and the two or more pairs of radial walls 164. The through holes 170 connect an atmosphere volume 168 defined by the inner wall 162 with the exterior environment, thus accommodating utility connections, such as electrical connection, gas connection, cooling fluid connection. The chassis 154 may include a central opening 158 for receiving the substrate support assembly 118.

The outer wall 160 of the flow module 106 is shaped to match the chamber body 140 of the process module 104. In one embodiment, the outer wall 160 may include a flange which corresponds to a flange on the chamber body 140. A plurality of bolts may be used to secure the flanges to couple the flow module 106 to the process module 104. In one embodiment, a seal 152 may be disposed between the flange of the chamber body 140 and the flange of the outer wall 160 to form a vacuum seal therebetween. The seal 152 may be an o-ring or other type of seal. In one embodiment, a RF grounding gasket 172 may be disposed between the flow module 106 and the process module 104 to provide a solid contact therebetween for a uniform and symmetric RF ground return path.

The inner wall 162, bottom wall 166, radial walls 164 and the chassis 154 divide the volume inside the outer wall 160 into the evacuation channels 114 and the atmosphere volume 168. The evacuation channels 114 connect with the process region 112 of the process module 104. A seal 156 may be disposed in the grooves 154b, 164b to provide vacuum seal between the evacuation channels 114 and the atmosphere volume 168. The seal 156 may be an o-ring or other type of seal, such as an elastomeric seal.

The outer wall 160 and the inner wall 162 may be cylindrical walls concentrically arranged. When assembled, a central axis of the outer wall 160 and the inner wall 162 coincides with the central axis 111 of the plasma process chamber 100. The two or more pairs of radial walls 164 are arranged between the inner wall 162 and the outer wall 160 to divide the space therebetween into the evacuation channels 114 and through holes 170. In one embodiment, the two or more pairs of radial walls 164 are arranged so that the evacuation channels 114 are symmetrical about the central axis 111. The flow module 106 may include three pairs of radial walls 164 disposed at 120 degrees apart from one another forming three evacuation channels 114 symmetrical to the central axis 111. The symmetrical arrangement of the evacuation channels 114 promotes symmetrical removal of gases from the process region 112, resulting in symmetrical flow of gases across the substrate 116. In addition, the symmetrical positioning of the evacuation channels 114 and radial walls 164 promotes symmetry in the thermal distribution and electrical conductance in the plasma process chamber 100.

The exhaust module 108 includes a symmetric flow valve 180 and a vacuum pump 182 attached to the symmetric flow valve 180. The vacuum pump 182 may be a symmetric turbo molecular pump in certain embodiments. The symmetric flow valve 180 connects to the evacuation channels 114 to provide symmetric and uniform flow in the plasma process chamber 100.

The substrate support assembly 118 is positioned along the central axis 111 to position the substrate 116 symmetrically about the central axis 111. The substrate support assembly 118 is supported by the chassis 154. The substrate support assembly 118 includes a support plate 174, a base plate 176 that are disposed in the process region 112, and a hollow shaft 178 disposed through the central opening 158 of the chassis 154. A bellows 184 may connect between the base plate 176 and the chassis 154 and surround the hollow shaft 178. The bellows 184 allows the substrate support assembly 118 to move vertically along the central axis 111 and provides vacuum seal between the atmosphere volume 168 in the flow module 106 and the process region 112 in the process module 104.

The support plate 174 may be an electrostatic chuck (ESC) having a chucking electrode 186. The chucking electrode 186 may be a monopolar 4-zone ESC, a bipolar 4-zone ESC, or a high temperature ESC. It is contemplated that the bipolar ESC may not require exposure to plasma for RF grounding during de-chucking of the substrate 116. The 4-zone ESCs may utilize four concentric heating zones (i.e. a heating element 188) to modulate center to edge heating profiles of substrates disposed on the chucking electrode 186 during processing to provide for improved temperature uniformity. The high temperature ESC may be suitable for utilization with temperatures up to about 600° C. Temperatures generated by the chucking electrode 186 may be suitable for sublimation of byproducts of substrate layers etched to maintain high material selectivity.

The support plate 174 may also include the heating element 188 for heating the substrate 116 during processing. The base plate 176 may include cooling channels 190 formed therein. The chucking electrode 186 may be connected to a bias power source 187 through the hollow shaft 178, the atmosphere volume 168 and one of the through holes 170. The heating element 188 may be connected to a heating power source 189 through the hollow shaft 178, the atmosphere volume 168 and one of the through holes 170. The cooling channels 190 may be connected to a cooling fluid source 191 through the hollow shaft 178, the atmosphere volume 168 and one of the through holes 170.

In one embodiment, an actuator assembly 192 may be coupled to the hollow shaft 178 to move the substrate support assembly 118 vertically. The actuator assembly 192 may enable the substrate support assembly 118 to move within the process region 112 and change a processing position of the substrate 116. For example, the actuator assembly 192 may position the substrate support assembly 118 a distance of between about 0.5 inches and about 6 inches from the plate stack 101. The reduced distance between the plate stack 101 and the substrate support assembly 118, when compared to conventional plasma processing apparatus, provides an increased capacitively coupled plasma (CCP) generation window in a low pressure regime, such as less than 20 mTorr, for example about 1 mTorr. Accordingly, a gap between the RF electrode (i.e. the plate stack 101) and RF ground may be increased to enable low pressure CCP discharge by reducing the breakdown voltage of the CCP. In embodiments generating a CCP, the substrate support assembly 118 may also function as an electrode (i.e. cathode) or ground via the grounding gasket 172, depending upon the desired implementation. The actuator assembly 192 may be disposed in the atmosphere volume 168. Lift pin actuators 194 may be disposed in the atmosphere volume 168 to move lift pins 196.

A plasma screen 198 may be disposed between the process region 112 and the evacuation channels 114 to confine the plasma within the process region 112. A substrate support liner 199 may be disposed around the substrate support assembly 118 to shield the substrate support assembly 118 from the process chemistry.

During operation, one or more processing gases from the gas source 132 may enter the process region 112 through the plate stack 101. Suitable process gases for utilization in a low pressure regime include $H_2$, He, Ar, $O_2$, $NF_3$, $NH_3$, $N_2$, $N_2O$, $H_2O$, $SiF_4$, $SiH_4$, $SiCl_4$, and various fluorocarbon precursors. An RF power may be applied between the plate stack 101 and the substrate support assembly 118 to ignite and maintain a direct plasma (ion generation) in the process region 112. The RF power may also be applied to the plate stack 101 via the gas inlet tube 126 and a remote plasma (radical generation) may be generated within the plate stack 101. Synchronized or step RF pulsing may be utilized to control the ion energy and radical density. A zero DC bias may be utilized and may provide for reduced ion bombardment which may enable reduced particle generation. Multiple RF frequencies (i.e. 400 kHz, 2 MHz, 13.56 MHz, 27 MHz, 40 MHz, 60 MHz) may be utilized to modulate plasma density and ion energy. Tailored waveform and phase angle modulation may be utilized to control ion energy distribution. It is contemplated that the RF power source 124 and RF matching network 125 may be configured to operation at powers as low as about 5 W while maintaining stable plasma discharge.

The substrate 116 disposed on the substrate support assembly 118 is processed by both the direct plasma and the remote plasma. For example, the direct plasma generated in the process region 112 may be utilized to modify materials on the surface of the substrate 116 by exposing the material to ions. Radicals generated from the remote plasma in the plate stack 101 may be extracted from the remote plasma to remove the modified materials with high selectivity to a non-modified material on the substrate 116. Accordingly, a highly selective material removal process may be achieved which provides for improved top flattening and reduce or eliminated footings and bowings of etched features. The removal process may be a cyclic process in which the ion modification and the radical removal processes are repeated in a sequential process until a desired feature profile is achieved.

In-situ chamber seasoning processes may also be implemented to reduce particle generation and metal contamination performance and to improve process stability. Silicon source chemistries, such as $SiF_4$, $SiH_4$, and $SiCl_4$, may react with oxygen dissociated under a CCP or inductively coupled plasma to form a silicon oxide layer on chamber surfaces. The chamber seasoning process may provide for improved stability in the aforementioned cyclic etching processes.

The one or more processing gases utilized to form the plasmas may be continuously supplied to the process region 112 or the plate stack 101 and the vacuum pump 182 operates through the symmetric flow valve 180 and the flow module 106 to generate a symmetric and uniform plasma profile adjacent the substrate 116. By defining the process region 112 and the evacuation channels 114 in separate modules, embodiments of the present disclosure provide uniform and symmetric process environment with simplified chamber structure, thus, reducing fabrication costs and enabling plasma damage free etching processes with high degrees of material selectivity.

Figure 2:
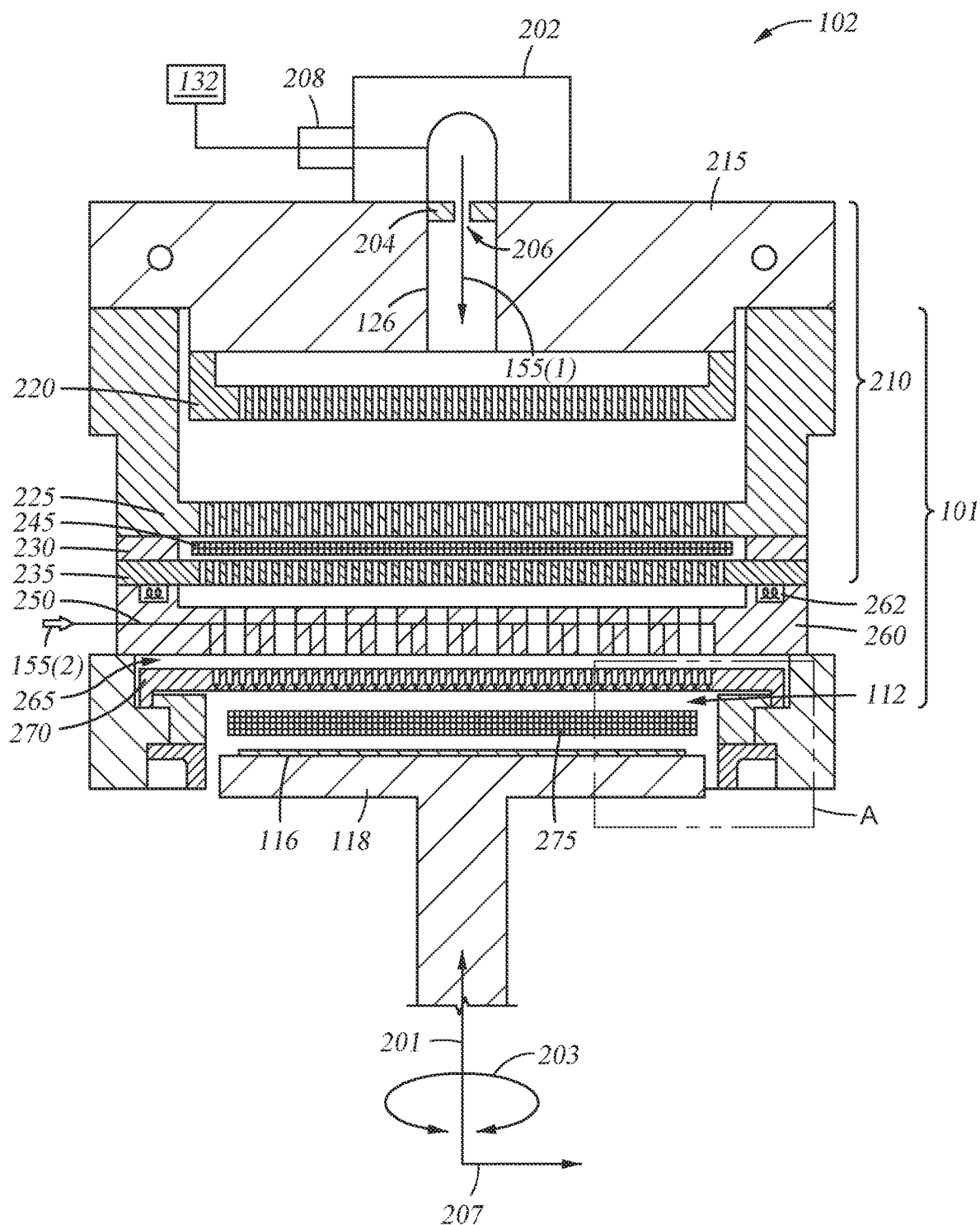
FIG. 2 schematically illustrates major elements of a plasma processing system, in a cross-sectional view according to one embodiment of the present disclosure.

FIG. 2 schematically illustrates a detailed view of the source module 102, in a cross-sectional view, according to an embodiment. The source module 102 is one example of the plasma source module 102 illustrated in FIG. 1 and it is contemplated that various other plasma source module designs may be advantageously implemented. The source module 102 includes a plasma source 210 and a process region 112 that may also generate a plasma, as discussed below. In the orientation of FIG. 2, a general direction of gas and/or plasma product flow is downwards, and this direction may be referred to as "downstream" herein, while an opposing direction upwards in the orientation of FIG. 2, may be referred to as "upstream." Also, significant portions of the apparatus shown in FIG. 2 may be cylindrically symmetric about a central axis 201, with associated directions being defined as a radial direction 207 and an azimuthal direction 203. This convention of directions may be used herein, although one skilled in the art will understand that many of the principles described herein are not limited to cylindrically symmetric systems.

As shown in FIG. 2, a plasma source 210 may introduce gases, and/or gases that are ionized by an upstream remote plasma source, as plasma source gases 212, through an RF electrode 215. A gas manifold 202 may be coupled to and/or disposed adjacent the RF electrode 215. Process gasses may be provided to the gas manifold 202 from the gas source 132. The process gases from the gas source 312 may enter the gas manifold 202 through a feed-through member 208. In one embodiment, the feed-through member 208 may be formed from a polymeric material, such as polytetrafluoroethylene. A flow centering insert 204 may be disposed within the gas inlet tube 126 adjacent the gas manifold 202. The flow centering insert 204 may be a ring like apparatus with an opening 206 formed therein. The opening 206 may be formed through the center of the insert 204 and the opening 206 may be a single aperture or may be multiple apertures. In the single aperture embodiment, a diameter of the opening 206 may be about 0.125 inches. The flow centering insert 204 may improve concentric flow distribution of process gases within the plate stack 101 of the plasma source module 102.

The RF electrode 215 may be electrically coupled to a first gas diffuser 220 and a face plate 225 that serve to redirect flow of the source gases so that gas flow is uniform across plasma source 210 (uniform from left to right in the view of FIG. 2). It should be noted that all of the diffusers or screens herein may be characterized as electrodes, as any such diffusers or screens may be tied to a particular electrical potential. An insulator 230 electrically insulates the RF electrode 215, including the face plate 225, from a second diffuser 235 that is held at electrical ground. The second diffuser 235 serves as a second electrode counterfacing the face plate 225 of the RF electrode 215.

Surfaces of the face plate 225, the second diffuser 235 and the insulator 230 define a first plasma generation cavity where a first plasma 245 (i.e. remote plasma) may be created when the plasma source gases 212 are present and RF energy is provided at the face plate 225 through the RF electrode 215. The RF electrode 215, the face plate 225, and the second diffuser 235 may be formed of any conductor, and in embodiments are formed of aluminum (or an aluminum alloy, such as the known "6061" alloy type).

Surfaces of the face plate 225 and the second diffuser 235 that face the first plasma 245 directly may be coated with ceramic layers of, for example, yttria (Y$_2$O$_3$) or alumina (Al$_2$O$_3$) for resistance to bombardment by energetic plasma products generated in the plasma 245. The ceramic coating may be formed by an electron beam coating process, an anodization process, and/or a non-pore anodization process. Other suitable coatings include nickel plated coatings and surface oxidation processes, for example, by exposure to a concentrated HNO$_3$ solution. Other surfaces of the face plate 225 and the second diffuser 235 that are not necessarily exposed directly to plasma, but are exposed to reactive gases and/or radicals generated by plasmas, may be coated either with ceramic layers (e.g., yttria, alumina) or with a suitable passivating layer (e.g., an anodized layer, or a chemically generated alumina layer) for chemical resistance. The insulator 230 may be any insulator, and in certain embodiments, is formed from a ceramic material.

Plasma products generated in the first plasma 245 pass through the second diffuser 235 that again helps to promote the uniform distribution of plasma products, and may assist in electron temperature control. Upon passing through the second diffuser 235, the plasma products pass through an a gas distribution device 260 that promotes uniformity. The gas distribution device 260 is also held at electrical ground. Apertures that pass completely through the gas distribution device 260 are of a diameter at least three times a diameter of apertures within the second diffuser 235. Also, the gas distribution device 260 includes further gas channels 250 that may be used to introduce one or more further gases 155(2) to the plasma products as they enter process region 112 (that is, gases 155(2) emerge only from a side of gas distribution device 260 that is distal to second diffuser 235). The gas distribution device 260 may also be made of aluminum or aluminum alloy, and like the face plate 225 and the second diffuser 235 discussed above, may be at least coated with a passivating layer for chemical resistance, or may be coated with a ceramic layer.

A heating element 262 may disposed in the plate stack 101 of the plasma source module 102. The heating element 262 may be a spiral shaped heater, such as a resistive heater or the like. The heating element 262 may be disposed in a groove formed in the gas distribution device 260 as illustrated, or may be disposed in groove formed in the second diffuser 235. Alternatively, the heating element 262 may be disposed in a groove formed in the gas distribution device 260 facing a plasma blocking screen 270. In another embodiment, the heating element 262 may be disposed in a groove formed in the plasma blocking screen 270 facing the gas distribution device 260. The heating element 262 may be configured to improve symmetric thermal distribution across the plate stack 101 and facilitate maintenance of the first plasma 245 and/or plasma products (i.e. radicals).

The gases 155(1), 155(2) and/or plasma products from the first plasma 245 enter a plenum cavity 265, then pass through the plasma blocking screen 270 to process region 112. Plasma blocking screen 270, also known as the SPI showerhead, may have a thickness in the range of between about 0.01 inches and about 1.0 inch, and many small apertures that are configured to allow gases and plasma products from upstream sources pass through into the process region 112 may be formed therein. The apertures of the plasma blocking screen 270 are generally high aspect ratio holes and a hole diameter of the apertures may be between about 0.01 inches and about 0.25 inches. The plasma blocking screen 270 substantially blocks downstream plasmas and plasma products from upstream components, as discussed in detail below. In embodiments, the plasma blocking screen 270 may advantageously form at least ten apertures per square inch in a central region thereof, and in certain embodiments may form thirty or more apertures per square inch.

Like the gas distribution device 260, the plasma blocking screen 270 is also held at electrical ground. Like the face plate 225 and the second diffuser 235 discussed above, surfaces of the plasma blocking screen 270 that are exposed directly to plasma are advantageously coated with ceramic (e.g., alumina or yttria) while surfaces that are not exposed directly to plasma may also be coated with ceramic, and are advantageously at least coated with a passivating layer for chemical resistance to reactive gases and activated species. In one embodiment, a detachable coating containing a silicon material may be disposed on the plasma blocking screen 270 to reduce defectivity and enable efficient replacement of the coating if the coating becomes damaged or operates with reduced efficiency.

All of the gases and/or plasma products, generated as described above, interact with the substrate 116 within the process region 112, and a second plasma 275 (i.e. direct plasma) may be generated within the process region 112. When a plasma is desired within process region 112, because the second diffuser 235 is held at electrical ground, RF power to create the second plasma 275 is applied to the substrate support assembly 118. A DC bias may also be applied to the substrate support assembly 118 to steer ions generated in the second plasma 275 to facilitate directional (anisotropic) etching of the substrate 116. In one embodiment, a 0 DC bias may also be utilized as biasing may be unnecessary if various other processing parameters are employed which do not benefit from the application of bias. The substrate support assembly 118 may be switchably connected with RF and/or DC bias sources, so as to generate a plasma within process region 112 at selected times and not at other times. The substrate support assembly 118 may be connected with the same RF power supply (power supply 124) as is used to create the first plasma 245 between the face plate 225 and the second diffuser 235, or may be connected with a different RF power supply (not illustrated).

The use of the plasma blocking screen 270, the ability to choose whether to generate a plasma by providing RF power and/or DC bias to substrate holder 135, or not to generate such plasma, and other features described herein, provide application flexibility when utilizing the plasma source module 102. For example, at a first time, the plasma source module 102 (implemented on and in concert with the chamber 100) may be operated in a mode wherein plasma is not generated within process region 112. At the first time, the gases and/or plasma products provided by upstream portions of the plasma source module 102 may provide isotropic etching, and the substrate support assembly 118 may be held at DC ground (although a DC offset may be provided across spatial portions of the substrate support assembly 118, to provide electrostatic chucking of the substrate 116). At a second time, the plasma source module 102 may be operated in a mode wherein plasma is generated within process region 112, and plasma products thereof may be steered by DC bias between the plasma blocking screen 270 and the substrate support assembly 118. At the second time, the plasma products steered by the DC bias may provide anisotropic etching, for example, to remove broad surface depositions on the substrate 116 while leaving sidewalls, or to clear materials within deep trenches in the substrate 116. Although the description above includes biasing, it is noted that embodiments described herein may utilize no DC bias in certain embodiments. Features of the plasma blocking screen 270 are illustrated in further detail in an enlarged view of a portion noted as A in FIG. 2 is illustrated in detail in FIG. 3.

Figure 3:
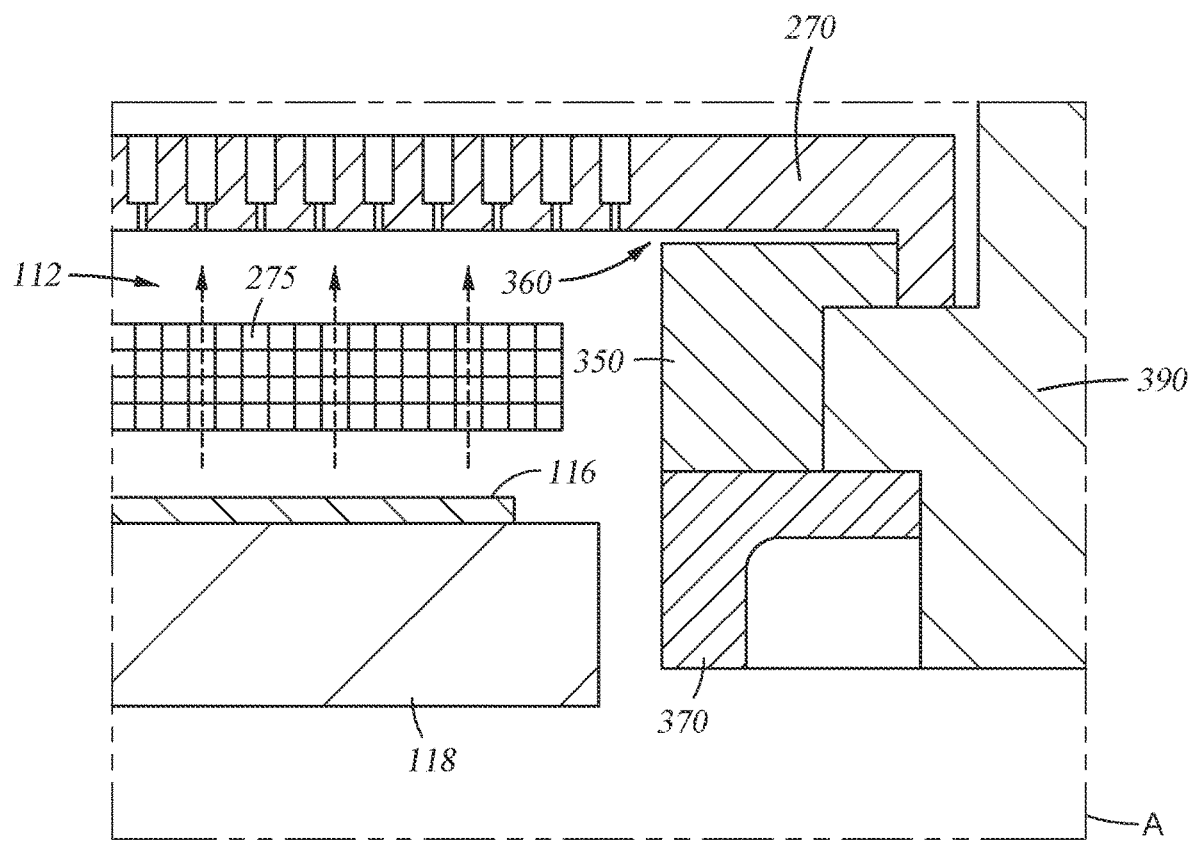
FIG. 3 schematically illustrates an enlarged portion of the plasma processing illustrated in FIG. 2 according to embodiments described herein.

FIG. 3 schematically illustrates region A noted in FIG. 2. As in FIG. 2, the substrate 116 is shown on the substrate support assembly 118 within process region 112. The gases 155 and/or previously formed plasma products flow through the plasma blocking screen 270 into the process region 112, where the second plasma 275 is formed. As noted above, the plasma blocking screen 270 is held at electrical ground. RF energy, and an optional DC bias, are applied to the substrate support assembly to provide energy for the second plasma 275. Due to the presence of both reactive species and ion bombardment sources within the process region 112, interior surfaces of the process region 112 are provided with materials (generally, but not limited to, ceramics) capable of resisting attack from such sources. Materials may also be chosen to manage electric field distributions, both in a DC sense and an AC sense, to maximize RF power delivery into the second plasma 275.

For example, the substrate support assembly 118 may be coated with alumina or aluminum nitride, and the plasma blocking screen 270 may be coated with alumina or yttria. An optional ceramic spacer 350 and/or an optional ceramic pumping liner 370 may be used to reduce lateral electric fields at the edge of the substrate support assembly 118. The ceramic spacer 350 and the ceramic pumping liner 370 are ring shaped such that they extend about a periphery of the process region 112, but not across the central region of the process region 112, and are advantageously fabricated from low loss tangent materials such as high purity alumina, silicon nitride and/or silicon carbide. Materials having loss tangents within the range of 0.1 to 0.0001 provide useful results, while materials having loss tangents within the range of 0.005 to 0.001 represent a range of high performance at reasonable cost.

Portions of both the plasma blocking screen 270 and the ceramic spacer 350 may be disposed atop a portion of a grounded lift plate 390, as shown, and obtain mechanical support therefrom. The lift plate 390 may be mechanically connected with the plasma blocking screen 270, the ceramic spacer 350 and other overlying structures so as to enable lifting of all such structures from the vicinity of the substrate support assembly 118 for assembly and/or maintenance purposes. The plasma blocking screen 270 is electrically grounded through contact with the lift plate 390. A thickness of the ceramic spacer 350 is controlled to leave a gap 360 between the plasma blocking screen 270 and the ceramic spacer 350, to ensure that the ceramic spacer 350 does not interrupt continuous contact of the plasma blocking screen 270 with the lift plate 390 in the azimuthal direction, about a periphery of the process region 112.

Forming the ceramic spacer 350 and the ceramic pumping liner 370 of low loss tangent dielectric materials is comparatively expensive (as compared to, for example, fabricating such items from aluminum with a ceramic coating) but reduces electric field effects at the edges of the substrate support assembly 118, and reduces reflected RF power when the second plasma 275 is generated within the process region 112. Substituting the ceramic spacer 350 and the ceramic pumping liner 370 also reduces ion bombardment related contamination as compared with equivalent aluminum parts used in the same locations. Use of the ceramic spacer 350 and the ceramic pumping liner 370 thus promotes plasma and process stability, and reduces contamination.

It is advantageous for electric fields between the substrate support assembly 118/substrate 116 and the plasma blocking screen 270 be strong and uniform in direction, since the electric fields steer ions involved with anisotropic etching. That is, to clear material at the bottoms of vertical trenches, the electric fields steering the ions are configured to be correspondingly vertical. Weaker fields exist between the substrate support assembly 118 and the grounded lift plate 390, through the ceramic spacer 350 and the ceramic pumping liner 370. These electric fields are weakened by the dielectric materials of the ceramic spacer 350 and the ceramic pumping liner 370 being interposed between the substrate support assembly 118 and the lift plate 390. Weakening the sideways electric fields at edges of the substrate support assembly 118 has two benefits; (1) electric field directionality, and thus etch directionality, is maintained out to edges of the substrate 116, and (2) the weaker fields generate less sputtering damage than higher fields.

Figure 4:
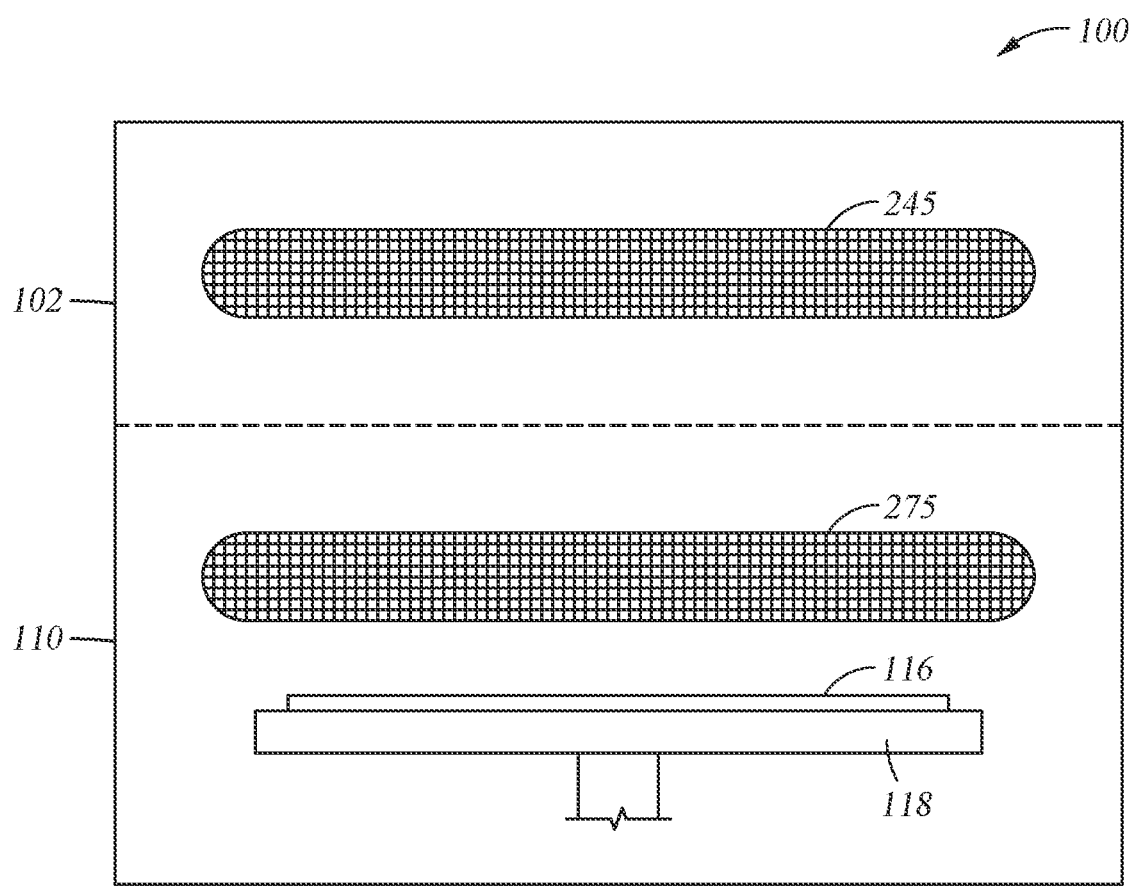
FIG. 4 schematically illustrates a processing chamber according to embodiments described herein.

FIG. 4 schematically illustrates the processing chamber 100 according to embodiments described herein. The chamber 100 includes the plasma source module 102 and the chamber module 110. The plasma source module 102 may be a radical plasma source as described with regard to FIG. 2. In one embodiment, the first plasma 245 may be generated in the plasma source module 102 of the chamber 100. The chamber 100 also includes the chamber module 110 which may be a direct plasma source, among other components, described with regard to FIG. 1. In one embodiment, the second plasma 275 may be generated in the process module 104 of the chamber module 110. It is contemplated that radicals from the first plasma 245 generated in the plasma source module 102 may be delivered to the chamber module 110 and utilized in combination with ions generated by the second plasma 275 which is generated in the chamber module 110. As illustrated, the substrate 116 may be positioned in the chamber module 110 and cyclic etching processes utilizing one or both of the first plasma radicals and the second plasma ion may be performed.

Methods enabled by the apparatus described herein include cyclic etching processes. In one embodiment, a direct plasma (i.e. second plasma 275) comprising ions may be utilized to modify one or more material layers on a substrate in a first operation. In a second operation, the modified material layers may be removed by radicals generated by a remote plasma (i.e. the first plasma 245). The first and second operation may be repeated one or more times until a desired etching profile is achieved.

While the foregoing is directed to embodiments of the present disclosure, other and further embodiments of the disclosure may be devised without departing from the basic scope thereof, and the scope thereof is determined by the claims that follow.

What is claimed is:

1. A processing chamber component for use in a processing chamber body facing an electrostatic chuck across a process region of the processing chamber body, the processing chamber component comprising:
    a plate stack comprising:
        a first gas diffuser;
        a faceplate disposed below the first gas diffuser;
        a second diffuser disposed below the faceplate;
        a first plasma generation cavity disposed between the faceplate and the second diffuser;
        a gas distribution device downstream of the second diffuser, the gas distribution device comprising apertures passing completely therethrough and gas channels which emerge from a side of the gas distribution device distal to the second diffuser and not from a side of the gas distribution device facing the second diffuser;
a plasma blocking screen disposed below the gas distribution device;
a lift plate mechanically supporting the plasma blocking screen; and
a ceramic spacer disposed adjacent to the plasma blocking screen, the ceramic spacer disposed on a portion of the lift plate, wherein a thickness of the ceramic spacer leaves a gap between the plasma blocking screen and the ceramic spacer.

2. The processing chamber component of claim 1, further comprising a plenum cavity formed between the gas distribution device and the plasma blocking screen.

3. The processing chamber component of claim 1, wherein the ceramic spacer is formed from a dielectric material selected from the group consisting of alumina, silicon nitride, and silicon carbide.

4. The processing chamber component of claim 1, wherein the ceramic spacer is formed from a dielectric material that is one or a combination of alumina, silicon nitride, or silicon carbide.

5. The processing chamber component of claim 1, further comprising a ceramic pumping liner configured to be disposed along a periphery of the process region.

6. The processing chamber component of claim 1, further comprising an isolator disposed between the faceplate and the second diffuser and electrically insulating the faceplate from the second diffuser.

7. The processing chamber component of claim 1, wherein the plasma blocking screen is electrically grounded through contact with the lift plate.

8. A processing chamber, comprising:
a chamber body defining a process region;
a substrate support assembly comprising an electrostatic chuck disposed within the process region;
a plate stack disposed above the substrate support assembly, the plate stack comprising:
a radio frequency (RF) electrode;
a gas injection tube formed through the RF electrode;
a first gas diffuser electrically coupled to the RF electrode;
a faceplate disposed below the first gas diffuser;
a second diffuser disposed below the faceplate;
a first plasma generation cavity disposed between the faceplate and the second diffuser;
a gas distribution device downstream of the second diffuser, the gas distribution device comprising apertures passing completely therethrough and gas channels which emerge from a side of the gas distribution device distal to the second diffuser and not from a side of the gas distribution device facing the second diffuser;
a plasma blocking screen disposed below the gas distribution device;
a lift plate mechanically supporting the plasma blocking screen; and
a ceramic spacer disposed adjacent to the plasma blocking screen, the ceramic spacer disposed on a portion of the lift plate, wherein a thickness of the ceramic spacer leaves a gap between the plasma blocking screen and the ceramic spacer.

9. The processing chamber of claim 8, further comprising a gas manifold disposed adjacent to the RF electrode and a gas source fluidly coupled to the gas manifold.

10. The processing chamber of claim 9, further comprising a flow centering insert disposed within the gas injection tube, wherein the flow centering insert further comprises a ring with a single aperture formed therethrough.

11. The processing chamber of claim 8, wherein the second diffuser is an electrode and has a plurality of apertures passing therethrough.

12. The processing chamber of claim 11, wherein each of the apertures passing through the gas distribution device have a diameter at least three times a diameter of each of the apertures passing through the second diffuser.

13. The processing chamber of claim 8, wherein the plasma blocking screen further comprises gas channels, the gas channels of the plasma blocking screen are configured to face the substrate support assembly across the process region.

14. The processing chamber of claim 8, wherein the ceramic spacer is formed from a dielectric material selected from the group consisting of alumina, silicon nitride, and silicon carbide.

15. The processing chamber of claim 8, further comprising a ceramic pumping liner disposed along a periphery of the process region.

16. The processing chamber of claim 8, further comprising an isolator disposed between the faceplate and the second diffuser and electrically insulating the faceplate from the second diffuser.

17. A processing chamber, comprising:
a chamber body defining a process region;
a substrate support assembly comprising an electrostatic chuck disposed within the process region;
a plate stack disposed above the substrate support assembly, the plate stack comprising:
a radio frequency (RF) electrode;
a gas injection tube formed through the RF electrode;
a first gas diffuser electrically coupled to the RF electrode;
a faceplate disposed below the first gas diffuser;
a second diffuser disposed below the faceplate;
an isolator disposed between the faceplate and the second diffuser and electrically insulating the faceplate from the second diffuser;
a first plasma generation cavity disposed between the faceplate and the second diffuser;
a gas distribution device downstream of the second diffuser, the gas distribution device comprising apertures passing completely therethrough;
a plasma blocking screen disposed below the gas distribution device;
a lift plate mechanically supporting the plasma blocking screen;
a ceramic spacer formed from a dielectric material and disposed adjacent to the plasma blocking screen, the ceramic spacer disposed on a portion of the lift plate, wherein a thickness of the ceramic spacer leaves a gap between the plasma blocking screen and the ceramic spacer; and
a ceramic pumping liner formed from the dielectric material.

18. The processing chamber of claim 17, wherein the gas distribution device further comprises gas channels passing through the gas distribution device and emerging only from a side of the gas distribution device distal to the second diffuser.

* * * * *